United States Patent
Mendoza et al.

(10) Patent No.: US 6,879,478 B2
(45) Date of Patent: Apr. 12, 2005

(54) SURGE COUNTER/DETECTOR APPARATUS, SYSTEM AND METHOD

(75) Inventors: Anthony-Cernan Mendoza, Calgary (CA); Dalibor Kladar, Calgary (CA); James Funke, Calgary (CA); Chi Thuong Ha, Calgary (CA); Henryk Jan Dabrowski, Calgary (CA); Mieczyslaw Bandura, Calgary (CA)

(73) Assignee: Eaton Corporation, Cleveland, OH (US)

( * ) Notice: Subject to any disclaimer, the term of this patent is extended or adjusted under 35 U.S.C. 154(b) by 336 days.

(21) Appl. No.: 10/284,782

(22) Filed: Oct. 31, 2002

(65) Prior Publication Data

US 2004/0085696 A1 May 6, 2004

(51) Int. Cl.[7] .................................................. H02H 3/08
(52) U.S. Cl. ....................................................... 361/93.1
(58) Field of Search ............................... 361/93.1, 119, 361/111, 117, 118

(56) References Cited

U.S. PATENT DOCUMENTS

| 4,338,648 | A | | 7/1982 | Subbarao |
| 4,706,016 | A | | 11/1987 | Schweitzer, Jr. |
| 4,796,283 | A | | 1/1989 | Brunner et al. |
| 5,572,116 | A | | 11/1996 | Kurasawa et al. |
| 5,914,662 | A | | 6/1999 | Burleigh |
| 6,038,118 | A | * | 3/2000 | Guerra ........................ 361/111 |
| 6,055,147 | A | | 4/2000 | Jeffries et al. |
| 6,122,157 | A | * | 9/2000 | Gerlach ....................... 361/124 |
| 6,160,692 | A | * | 12/2000 | Zaretsky ....................... 361/86 |

* cited by examiner

Primary Examiner—Michael Sherry
Assistant Examiner—James A Demakis
(74) Attorney, Agent, or Firm—Martin J. Moran

(57) ABSTRACT

A surge counter/detector apparatus includes current sensors communicating with power lines to sense a surge condition. A trigger circuit communicates with the current sensors and outputs a first signal in response to the sensed surge condition. The trigger circuit is reset and enabled by a second signal in order to enable subsequent output of the first signal. A processor detects the first signal from the trigger circuit and responsively increments and displays a count value at a display. The processor provides the second signal having a first state to reset the trigger circuit and a second state to enable the trigger circuit. The processor includes a timer to vary a time between (a) detecting the first signal, and (b) resetting and enabling the trigger circuit.

21 Claims, 4 Drawing Sheets

SURGE COUNTER/DETECTOR APPARATUS, SYSTEM AND METHOD

BACKGROUND OF THE INVENTION

1. Field of the Invention

The invention relates to detecting and counting surges, and, more particularly, to surge counter/detector apparatus and systems, such as, for example, low voltage metal oxide varistor (MOV) based surge suppressor systems. The invention also relates to a method for detecting and counting surge conditions on a power line.

2. Background Information

Surge arresters primarily protect the insulation breakdown of a conductor, such as an electric utility conductor. For example, an overhead transmission tower is employed to distribute electrical power from a generating plant to a substation, and then to end users, such as residential, commercial and industrial users. In a transmission tower, insulation is provided by the air space between conductors. A surge arrester prevents arcing between power line phases by diverting current caused by a transient overvoltage condition to the ground return path. The overvoltage condition may be attributed, for example, to lightning or capacitor bank switching. In an underground electrical system, where plastic or rubber insulation is employed, a surge arrester prevents rupturing of the insulation. Although the magnitude of the overvoltage is reduced, such reduced voltage may, nevertheless, damage downstream electrical equipment.

Surge suppressors, like surge arresters, are voltage clamping devices, which are employed to protect a load, such as, for example, appliances, computers and other electrical equipment, from surges. As such, a surge suppressor usually clamps the load voltage at a suitable voltage, which is less than the clamping voltage of the surge arrester. At the same time, the surge suppressor protects such electrical equipment from internal surge sources (e.g., after a circuit breaker panelboard), which result from other equipment (e.g., motor switching; operation of a switch to disconnect a load). The surge suppressor, thus, protects a load from both external sources (e.g., lightning voltage remnants) and internal disturbances (e.g, caused by other equipment). Surge suppressors typically include one or more capacitors to filter high frequency noise.

As defined by IEEE C62.41, there are three types of surges: (1) oscillatory surges or "ring waves" (e.g., a surge delivered to an electrical system excites natural resonant frequencies and, as result, has an oscillatory waveform less than about 1 kHz to 500 kHz, and may have different amplitudes); (2) high energy surges resulting from, for example, lightning, opening of a fuse, or power factor capacitor switching; and (3) a burst of very fast surges resulting from opening of air-gap switches or relays, which are typically represented by a 5 ns rise time and a 50 ns duration with various amplitudes. IEEE C62.41 also defines location categories with representative waveforms: (1) Category A: outlets and long branch circuits; (2) Category B: feeders, short branch circuits and distribution panels; and (3) Category C: outside and service entrance, such as run between a meter and a panel. For example, the lowest peak voltage and peak current is in Category A (e.g., 2 kV, 70 A), and the highest peak voltage and peak current is in Category C (e.g., 20 kV, 10 kA).

In order to count these diverse surges, a surge detector/counter must be able to work with various magnitudes and frequencies. At the same time, the surge detector/counter must be suitably fast in order to capture such surges. Furthermore, the surge detector/counter must count relatively high current surges coming from external sources and relatively low magnitude internal surges.

U.S. Pat. No. 4,338,648 discloses a surge counter in which the voltage across an arrester is rectified and stored in a capacitor, which acts as a peak detector. With this arrangement, fast rising transients are not captured and the counting circuit is exposed to high voltages.

U.S. Pat. No. 4,706,016 discloses a surge counter, which measures the voltage generated on a conductor ground return path. A capacitor stores the voltage, which is displayed by a counting circuit, which is exposed to high voltages.

U.S. Pat. No. 4,796,283 discloses a surge counter, which uses a current sensor on a ground return path and optically transfers the generated voltage to a counting circuit. A monostable generates a pulse, which increments the counter. The monostable pulse must be long enough in order to be detected by the display, but cannot be too long or, else, subsequent surges are not counted. Therefore, the timing is imprecise and is fixed for a particular counter.

Surge suppressors must protect the load or protected electrical device from lightning (e.g., voltage remnants from the surge arrester) and, also, from locally generated transients. Therefore, the corresponding counter must count both relatively high magnitude and relatively low magnitude transients.

U.S. Pat. No. 5,572,116 discloses a surge counter, which employs a spark gap as a sensor by measuring its light output. As such, the corresponding surge suppressor must have a spark gap. This is because the spark trigger voltage is dependent upon the rise time of the transient. If the surge suppressor is MOV based, then, for relatively fast rising transients, the MOV turns-on before the spark-gap, and, therefore, no sparking or light output is detected by the surge counting circuit. Hence, the circuit requires a spark gap to operate.

The known prior art does not prevent multiple false counting of various oscillatory type or "ring wave" surges.

There is a need for a surge counter/detector that counts a wide range of surges with different magnitudes and speeds.

SUMMARY OF THE INVENTION

These needs and others are met by the present invention, which provides a surge counter/detector apparatus, system and method for counting transient overvoltage conditions for a low voltage system (e.g., less than about 1000 VAC).

In response to a transient overvoltage condition, which has a magnitude greater than nominal voltage, one or more surge suppressor MOVs conduct. When such an MOV conducts, this generates a current and a corresponding current transducer develops a voltage. This voltage causes a trigger circuit to change state, which provides a first signal. A microcontroller senses this signal and increments a counter, which is displayed. The trigger circuit stays in a first state and changes state upon receiving a second signal from the microcontroller. Upon receiving the second signal, the trigger circuit is ready for re-triggering. The microcontroller resets the trigger circuit, in order to be able to detect a subsequent surge. The trigger circuit, once set, will only reset upon the command of the microcontroller. In this manner, the microcontroller need only check the output of the trigger circuit in order to determine if a surge condition has occurred. The microcontroller may then count and display the surge condition.

As one aspect of the invention, a surge counter/detector apparatus comprises: at least one current sensor operatively associated with at least one power line to sense a surge condition; a trigger circuit communicating with the at least one current sensor, the trigger circuit outputting a first signal in response to the sensed surge condition, and being reset and enabled by a second signal in order to enable subsequent output of the first signal; a display; and a processor detecting the first signal from the trigger circuit, and responsively incrementing and displaying a count value at the display, the processor providing the second signal having a first state to reset the trigger circuit and a second state to enable the trigger circuit, the processor including a timer to vary a time between (a) detecting the first signal, and (b) resetting and enabling the trigger circuit.

The at least one power line may be a plurality of power lines. The at least one current sensor may be a plurality of current sensors communicating with the power lines, with each of the current sensors having a pair of outputs, and with the outputs being electrically connected in series in order to provide one pair of outputs to the trigger circuit.

The processor may determine the time based upon an initial value, an incremental value, and a count of events determined by detecting the first signal, with the time equaling the initial value plus the incremental value times the count.

The timer may be a second timer. The processor may further include a first timer, which resets the second timer and restores the time to the initial value.

As another aspect of the invention, a surge counter/detector system comprises: a surge suppressor for a plurality of power lines; a plurality of current sensors operatively associated with the power lines to sense a surge condition; a trigger circuit communicating with the current sensors, the trigger circuit outputting a first signal in response to the sensed surge condition, and being reset and enabled by a second signal in order to enable subsequent output of the first signal; and a processor detecting the first signal from the trigger circuit, and responsively incrementing and displaying a Count value, the processor providing the second signal having a first state to reset the trigger circuit and a second state to enable the trigger circuit, the processor including a timer to vary a time between (a) detecting the first signal, and (b) resetting and enabling the trigger circuit.

As another aspect of the invention, a method for detecting and counting surge conditions comprises: employing at least one current sensor to sense a surge condition on at least one power line; employing a trigger circuit to receive the sensed surge condition from the at least one current sensor; outputting a first signal at the trigger circuit in response to the received sensed surge condition; resetting and enabling the trigger circuit by a second signal in order to enable subsequent output of the first signal; detecting the first signal from the trigger circuit and responsively incrementing and displaying a count value; outputting the second signal to reset and enable the trigger circuit; and varying a time between (a) detecting the first signal, and (b) outputting the second signal.

The method may include determining the time based upon an initial value, an incremental value, and a count of events determined by detecting the first signal.

The method may further include resetting the time to the initial value after a predetermined time.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
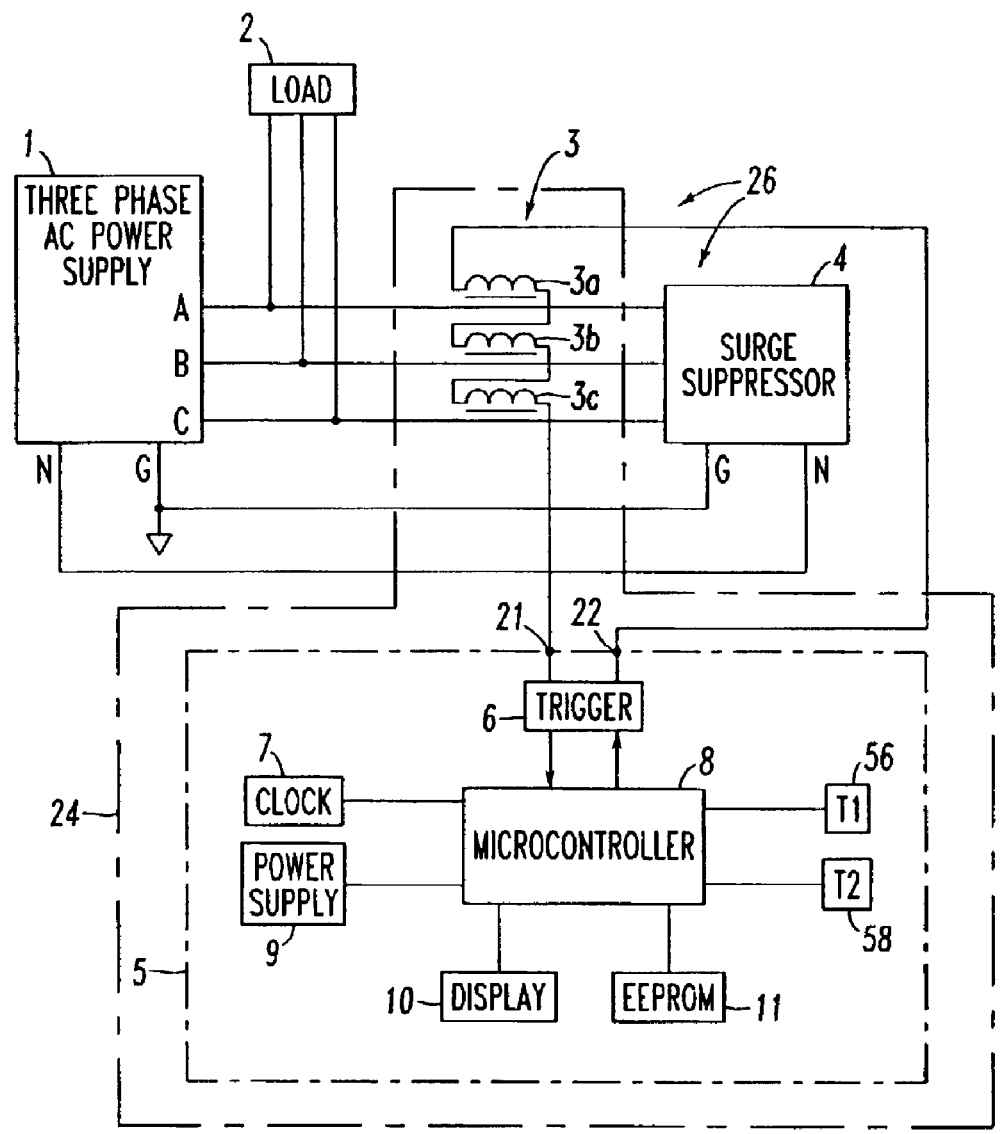
FIG. 1 is a block diagram of a surge counter/detector apparatus and system in accordance with an embodiment of the present invention.

Referring to FIG. 1, an alternating current (AC) power supply 1 (e.g., three-phase wye) is electrically connected to a load 2 (e.g., three-phase equipment being protected). Three current transducers 3, such as current sensors 3a,3b,3c, are operatively associated with the three power supply phases A,B,C, respectively, and with a surge suppressor 4 (e.g., three-phase), which is electrically connected in parallel with the load 2. The three current transducers 3 are electrically connected in series and, thus, have only two outputs, which are electrically connected (e.g., at nodes or points 21,22 as discussed below in connection with FIG. 2A) to a surge counter circuit 5.

For example, the current sensor 3a may sense a surge for phase A, which surge is conducted by a corresponding surge suppressor MOV (e.g., 40a or 42a of FIG. 2A) of the surge suppressor 4 (e.g., from line-to-ground; line-to-neutral; line-to-line (not shown)). As another example, if a surge originates from the AC power supply 1, then the surge suppressor 4 provides a suitably low impedance path, which conducts and diverts the current (e.g., to neutral or ground), thereby clamping the corresponding phase voltage and protecting the load 2 from damage.

The surge counter circuit 5 includes a trigger circuit 6, a clock 7, a microcontroller 8, a power supply 9, a display 10, and a suitable memory, such as EEPROM 11. The surge counter circuit 5 and the current transducers 3 form a surge counter/detector apparatus 24. The surge suppressor 4 and the surge counter/detector apparatus 24 form a surge counter/detector system 26.

Figure 2A:
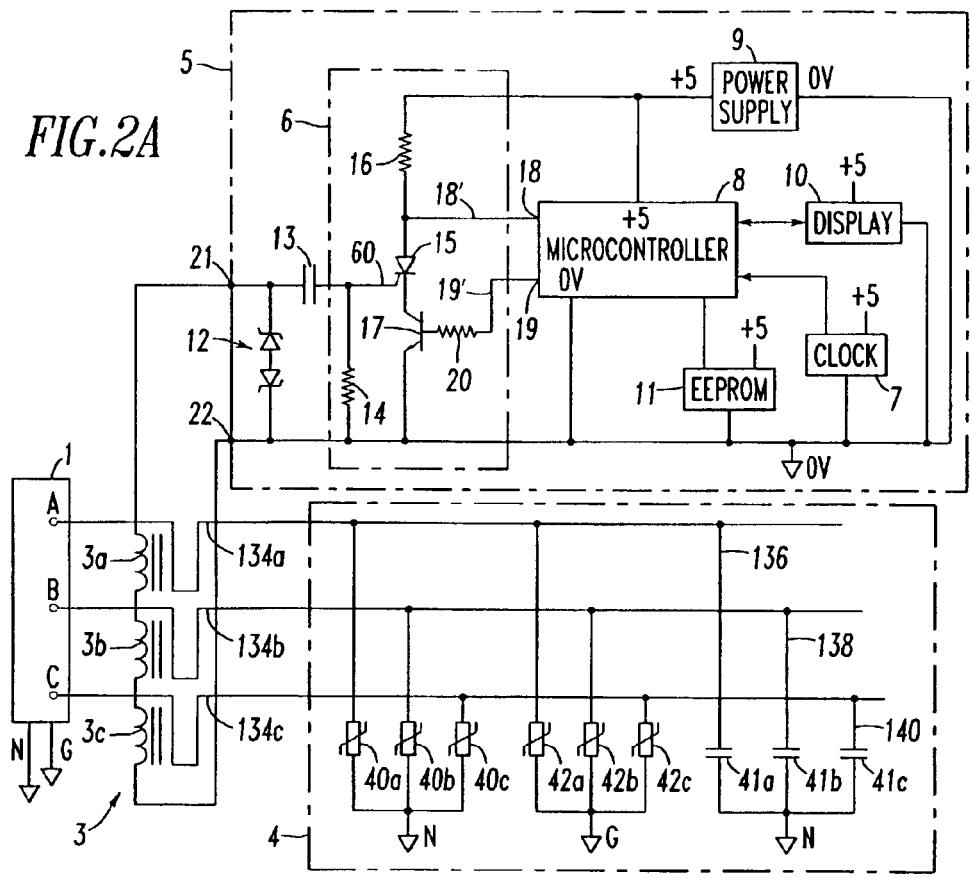
FIG. 2A is a block diagram in schematic form of the surge counter/detector of FIG. 1.

Referring to FIG. 2A, details of the surge suppressor 4 and trigger circuit 6 are shown. The two outputs (e.g., wires) of the series-connected current sensors 3a,3b,3c are electrically connected to points 21 and 22 of the surge counter circuit 5. The current sensors 3a,3b,3c may be constricted, for example, from a T90 core, marketed by Micrometals, Inc. of Anaheim, Calif., with 6 turns of AWG 28 magnet wire. When there is a surge, the surge suppressor 4 conducts, thereby causing one (e.g., for a phase to ground or phase to neutral surge) (or perhaps more for a line to line surge) of the current sensors 3a,3b,3c to generate a voltage. The series combination of two zener diodes 12 is electrically connected between the points 21 and 22, in order to protect the input of a capacitor 13 from an overvoltage condition. The point 22 is electrically connected to the ground reference (0V) of the +5 VDC power supply 9. The series combination of the capacitor 13 and a resistor 14 is electrically connected between the points 21 and 22, in order to provide an input (at line 60) to the gate of SCR 15. Hence, the capacitor 13 couples the voltage from the current sensors 3a,3b,3c to the SCR gate.

A resistor 16 is electrically connected between the output (e.g., +5 VDC) of the power supply 9 and the anode of the SCR 15. The collector of NPN transistor 17 is electrically connected to the cathode of the SCR 15, with this transistor's emitter being electrically connected to the power supply ground reference (0V) and the point 22. When turned-on, the transistor 17 connects the SCR cathode to the power supply ground reference (0V). The resistor 16 provides a pull-up for the SCR anode, which is electrically connected to a digital input 18 of the microcontroller 8. When the SCR 15 conducts, the resistor 16 is pulled low, which provides a signal 18'. The microcontroller 8 senses this signal 18' and interprets the same as the occurrence of a surge. The microcontroller 8 responsively displays this information on the display 10 and stores the information in the EEPROM 11. Since the SCR 15 is latched, in order to return to its untriggered state, the microcontroller 8 sends a low signal 19' through digital output 19 to resistor 20, which is electrically connected between the output 19 and the base of the transistor 17. This causes the transistor 17 to turn off, which un-latches the SCR 15. In turn, the microcontroller 8 sends a high signal 19' through the digital output 19, thereby causing the transistor 17 to turn on, which enables the SCR 15. In this manner, if the microcontroller 8 is busy when a surge occurs, then the surge condition may be detected through the latching mechanism of the SCR 15.

As shown in FIG. 2A, the surge suppressor 4 may include, for example, varistors 40a,40b,40c and capacitors 41a,41b, 41c, which are electrically connected between the three power supply phases A,B,C, respectively, and the power supply neutral N. The surge suppressor 4 may also include, for example, varistors 42a,42b,42e, which are electrically connected between the three power supply phases A,B,C, respectively, and the power supply ground G. These components of the exemplary surge suppressor 4 provide six modes of protection, namely, phase A-to-ground, phase B-to-ground, phase C-to-ground, phase A-to-neutral, phase B-to-neutral, and phase C-to-neutral.

Figure 2B:
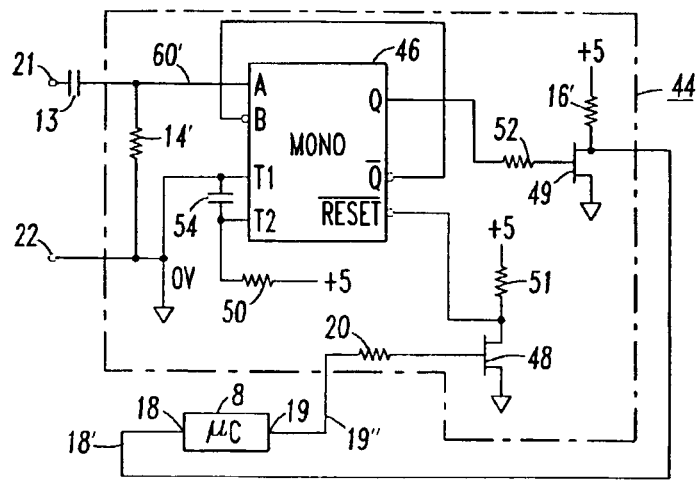
FIG. 2B is a block diagram in schematic form of a trigger circuit for a surge counter/detector in accordance with another embodiment of the invention.

FIG. 2B shows another trigger circuit 44, which employs a monostable multivibrator (MONO) 46 as a trigger device, along with FETs 48,49, resistors 14',20,50,51,52, and capacitor 54. The resistor 50 and the capacitor 54 set the monostable pulse output width (through the T1 and T2 inputs), which width is of a suitable duration, in order to be detected by the microcontroller ($\mu$C) 8. As shown in FIG. 1, the microcontroller 8 provides a first timer 56 having a period T1 and a second timer 58 having a period T2. The pulse width of the monostable high-true output Q is greater than the period T1 of the first timer 56. The monostable input A is electrically connected by line 60' to the capacitor 13 in a similar manner as the gate of the SCR 15 of FIG. 2A is electrically connected by the line 60 to the capacitor 13. The resistor 14' is electrically connected between the monostable input A and the power supply ground reference (0V). The monostable low-true output Q/ is electrically connected to the monostable low-true input B/.

Continuing to refer to FIG. 2B, when there is a surge, the monostable output Q changes state, turns on the FET 49 through resistor 52, and pulls resistor 16' to ground. The microcontroller 8 determines that a surge has occurred through the signal 18' at digital input 18 and responsively sends a high signal 19" through the digital output 19 and the resistor 20, in order to turn on FET 48. This pulls the monostable low-true reset input RESET/low. In turn, the microcontroller 8 sends a low signal 19" through the digital output 19 and the resistor 20, in order to turn off FET 48. This sets the monostable low-true reset input RESET/high, which allows the monostable 46 to be re-triggered again. The period T2 of the second microcontroller timer 58 is employed as a time delay for the signal 19" output to the digital output 19. For a surge that has an oscillatory waveform or "ring wave" output, in order to prevent multiple false triggering, the time delay for Counting (i.e., period T2) is increased as discussed below in connection with FIG. 3.

It will be appreciated that the above discussion of the timers 56,58 applies to both of the trigger circuits 6,44, except that the signal 19' of FIG. 2A and the signal 19" of FIG. 2B have opposite polarities.

Figure 3:
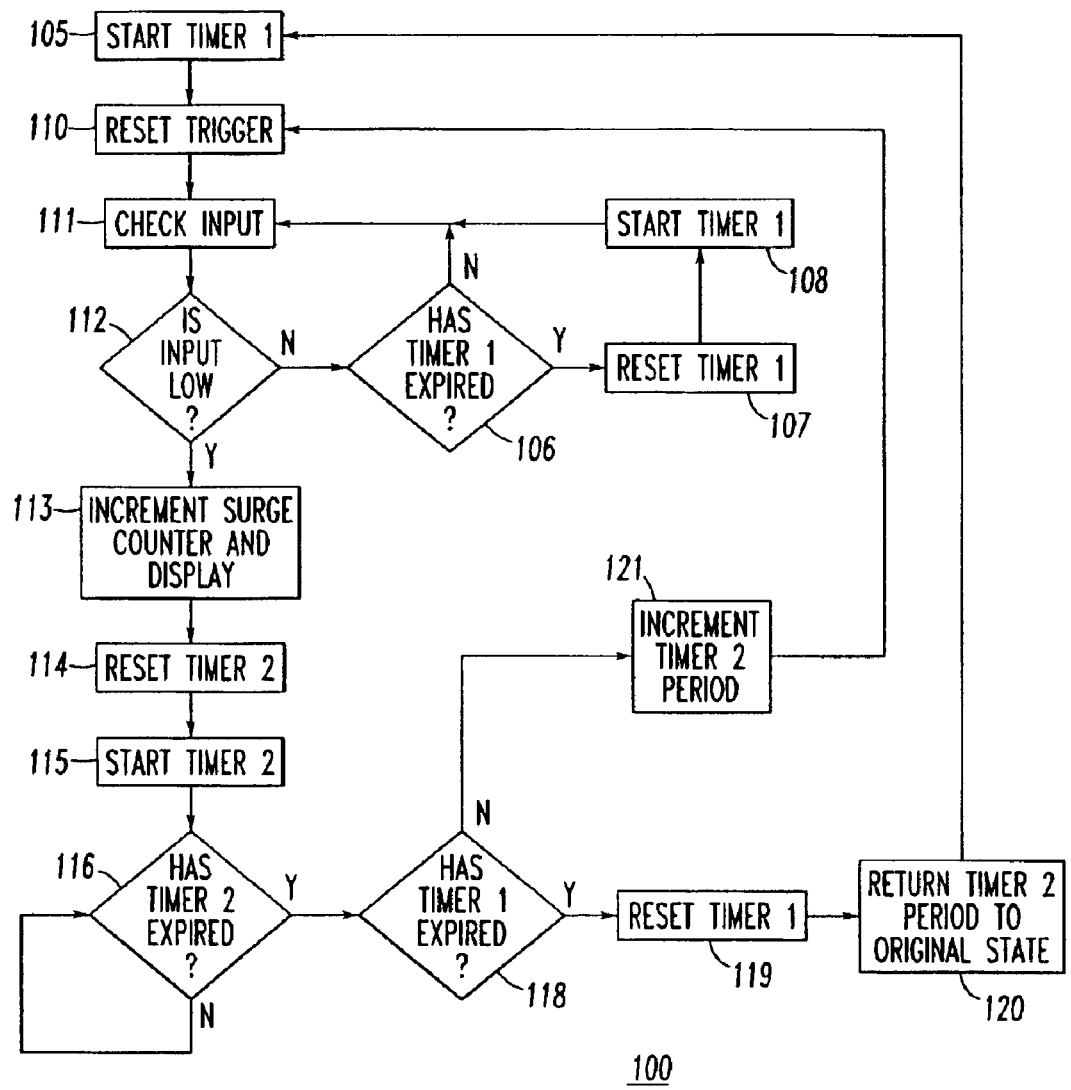
FIG. 3 is a flowchart of a surge counting routine for the microcontroller of FIG. 1.

Referring to FIG. 3, a routine 100 for the microcontroller 8 of FIG. 1 is shown. This routine 100 may be employed with the trigger circuit 6 of FIGS. 1 and 2A (as discussed below) or with minor modification (as discussed below) with the trigger circuit 44 of FIG. 2B. First, at 105, the microcontroller 8 starts the first timer 56. Next, at 110, the microcontroller 8 outputs a low-true pulse or signal 19' on the digital output 19 (e.g., through transistor 17 of FIG. 2A) in order to reset (when low) and enable (when high) the trigger circuit 6. Alternatively, the microcontroller 8 outputs a high-true pulse or signal 19" on the digital output 19 (e.g., through FET 48 of FIG. 2B) in order to reset (when high) and enable (when low) the trigger circuit 44. Then, at 111, the microcontroller 8 reads the signal 18' from the digital input 18. If that signal is low, at 112, then, at 113, a value (not shown) on the display 10 is incremented to show the surge and, also, the EEPROM 11 is updated. Otherwise, if the signal 18' at the digital input 18 is not low, then, at 106, the microcontroller 8 checks if the first timer 56 has expired. If not, then step 111 is repeated to recheck the digital input 18. On the other hand, if the first timer 56 has expired, then, at 107 and 108, the microcontroller 8 resets and restarts, respectively, the first timer 56, after which step 111 is repeated to recheck the digital input 18.

After step 113, at 114 and 115, the microcontroller 8 resets and restarts, respectively, the second timer 58. Next, after 115 at 116, the microcontroller 8 checks whether the second timer 58 has expired. If not, then step 116 is repeated. Otherwise, at 118; the microcontroller 8 checks whether the first timer 56 has expired. If so, at 118, then the microcontroller 8 resets the first timer 56 at 119, returns the period of the second timer 58 to its original state at 120, and resumes execution at 105.

On the other hand, if the first timer 56 has not expired at 1118, then the period of the second timer 58 is suitably increased, at 121, before resetting the trigger at 110. Thus, the time delay between counting a surge, at 113, and resetting the trigger, at 110, is increased. This adds a suitable delay, in order to prevent multiple false counting of events of an oscillatory waveform or "ring wave". Hence, the period of the second timer 58 is increased as the number of surges is counted, in order to prevent multiple false Counting of periodic events like a "ring wave". However, at the same time, if the period of the second timer 58 becomes too long, then the surge counter circuit 5 will not be able to detect surge events during that timer period. Therefore, the period of the second timer 58 is returned to its original state at 120.

The routine 100 described above automatically minimizes miscounting. For example, the period T1 of the first timer 56 may be set to 500 $\mu$s. The period of the second timer 58 may be initially set to 10 $\mu$s. If after the first timer 56 is started, a first surge occurs, then the second timer 58 is started at 115. If, for example, 24 $\mu$s after the first surge, a second surge occurs, then that surge would also be counted. If, for example, 23 $\mu$s after the second surge, a third surge occurs, then that surge would also be counted.

This is because, after the first surge is counted at 113, the second timer 58 expires after 10 μs at 118, and is incremented by 6 μs (e.g., the incremental period at step 121 for the second timer 58 in this example), at 121, to 16 μs. The second surge is eventually counted at 113, after which the second timer 58 expires after 16 μs at 118, and is incremented by 6 μs (e.g., the incremental period at step 121 for the second timer 58 in this example), at 121, to 22 μs.

Now, if, for example, a fourth surge occurs 21 μs after the third surge, then that surge would not be counted. This is because the period of the second timer 58 was incremented to 22 μs, which means, in this example, that the fourth surge occurred 21 μs after the third surge, but the trigger was not reset, at 110, until about 22 μs after the third surge.

In this example, the first timer 56 expires after the period, 500 μs, and the period of the second timer 58 is reset to 10 μs, at 120. Although exemplary timer periods of 500 μs and 10 μs, and an exemplary incremental period of 6 μs are disclosed, a wide range of periods and incremental periods may be employed.

Figure 4:
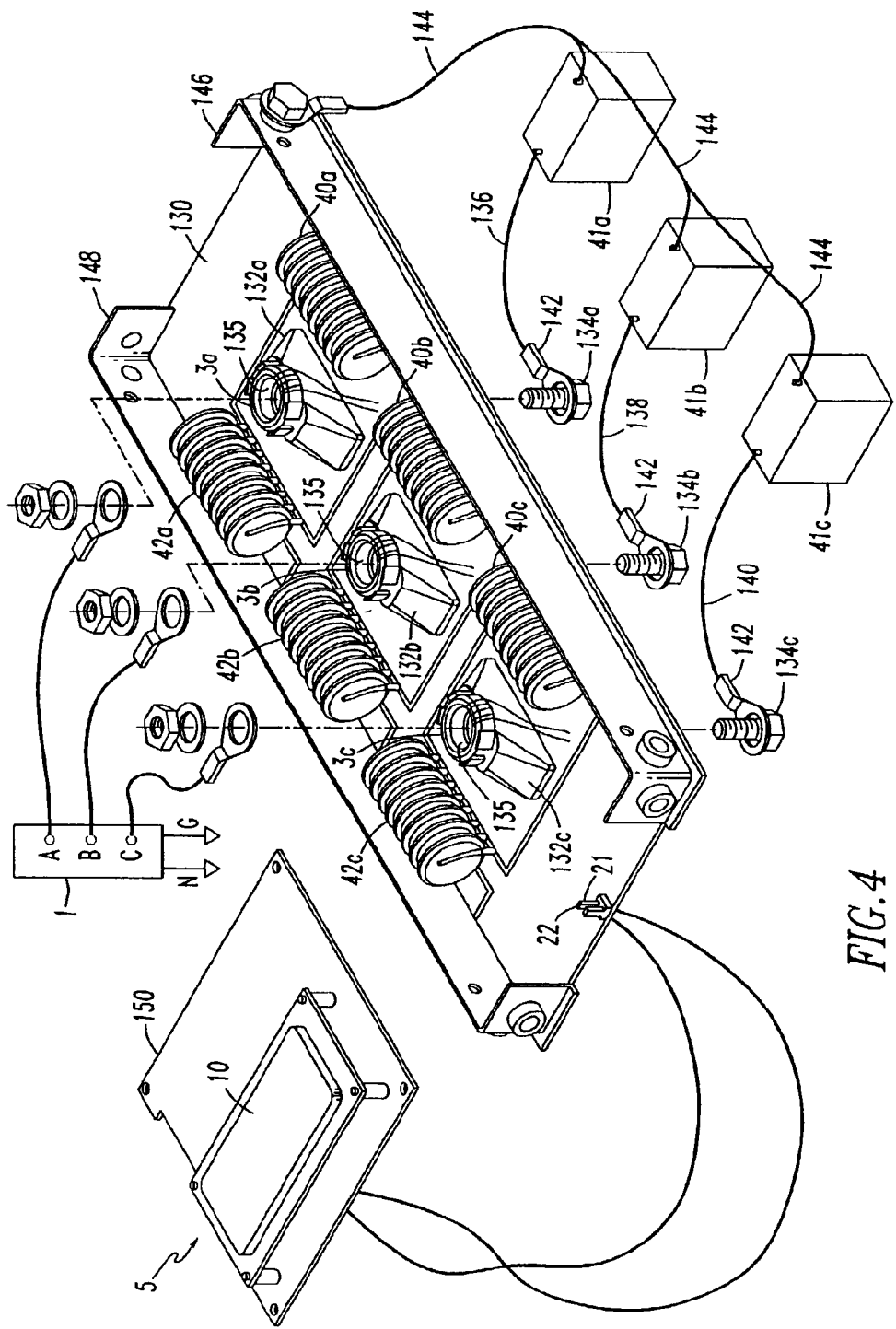
FIG. 4 is an isometric view of components of the surge counter/detector of FIG. 1.

Referring to FIG. 4, current sensors 3a,3b,3c are held in place on a surge printed circuit board 130 by holders 132a, 132b,132c, respectively. Bolts 134a,134b,134c pass through the openings 135 of the sensors 3a,3b,3c and, also, electrically connect to the AC lines A,B,C (FIG. 2A), respectively, which lines are also electrically connected to the protected load 2 (FIG. 1). Three bus bar or ring terminals 142 are employed to electrically connect the head portion of the bolts 134a,134b,134c by conductors 136,138,140 to the capacitors 41a,41b,41c, respectively. The opposite threaded ends of these bolts 134a,134b,134c are suitably electrically connected (not shown) to the AC lines A,B,C. In this manner, the bolts 134a,134b,134c conduct the currents, which pass through the current sensors 3a,3b,3c, respectively. The one side of the capacitors 41a,41b,41c is electrically connected to the bolts 134a,134b,134c, respectively, and the other side is electrically connected by conductors 144 to a neutral bus bar 146. The printed circuit board 130 provides suitable electrical connection of the MOVs 42a, 42b,42c to a ground bus bar 148 and suitable electrical connection of the MOVs 40a,40b,40c to the neutral bus bar 146.

High frequency noise generated by transients is diverted toward the neutral bus bar 146, which may be sensed by the current sensors 3a,3b,3c. Another printed circuit board 150 includes the surge counter circuit 5 having the trigger circuit 6, the clock 7, the microcontroller 8, the power supply 9, and the display 10 of FIG. 1.

The exemplary surge counter/detector apparatus 24 detects a wide range of surge current as defined in IEEE C62.41 for low voltage AC circuits. This apparatus prevents multiple false counting of oscillatory waveforms or "ring waves" through the use of two timers 56 and 58. The second timer 58 has a variable pulse width and the first timer 56 has a fixed pulse width, which is employed to reset the second timer 58 to its initial value.

The simple construction of the current transducer 3, as provided by the current sensors 3a,3b,3c, allows the surge counter/detector apparatus 24 to be employed in cost sensitive applications. The current sensors are suitably sensitive, in order that only a few turns of wire are needed, thereby reducing the footprint. The capacitors 41a,41b,41c, as electrically connected with the surge suppressor 4, allow such suppressor to capture relatively fast rising transients. These capacitors act as low pass filters with suitably low impedance, thereby allowing counting of relatively fast rising transients. Since the current transducer 3 employs relatively few turns of the magnet wire, it does not generate a voltage in response to a swell or continuous overvoltage.

The exemplary surge counter/detector apparatus 24 functions, for example, with a 3-phase wye, delta, or a split phase power supply, such as 1. The current sensors 3a,3b,3c are electrically connected to corresponding phase connections of the surge suppressor 4 and may be embedded inside or connected outside of such surge suppressor. Each of the current sensors 3a,3b,3c has its own core, although the windings are electrically connected in series in order to provide a two-wire output. In this manner, a number of current sensors may be electrically connected, while still providing a single two-wire output. This series connection not only reduces the number of outputs but, also, reduces the relatively fast rise time of the voltage generated by a particular current sensor. The other one or more current sensors function as an inductor when another current sensor conducts. When the current sensor coil acts as an inductor, this increases the rise time, thereby reducing the steepness of the generated coil voltage.

The exemplary surge counter/detector apparatus 24 counts line-to-ground, line-to-neutral, and line-to-line surges.

It will be appreciated that while reference has been made to the exemplary microcontroller 8, a wide range of other suitable processors such as, for example, mainframe computers, mini-computers, workstations, personal computers (PCs), microprocessors, microcomputers, and other microprocessor-based computers may be employed having internal and/or external memory and/or timers.

As employed herein, the terms "display" and "displaying" shall expressly include, but not be limited to, computer displays for displaying information, such as a count of surges. It will be appreciated that such information may be stored (e.g., in any suitable memory or storage), printed on hard copy, be computer modified, be combined with other data, or be transmitted for display elsewhere. All such processing shall be deemed to fall within the terms "display" or "displaying" as employed herein.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A surge counter/detector apparatus for at least one power line, said apparatus comprising:

at least one current sensor operatively associated with said at least one power line to sense a surge condition;

a trigger circuit communicating with said at least one current sensor, said trigger circuit outputting a first signal in response to said sensed surge condition, and being reset and enabled by a second signal in order to enable subsequent output of said first signal;

a display; and a processor detecting the first signal from said trigger circuit, and responsively incrementing and displaying a count value at said display, said processor providing the second signal having a first state to reset said trigger circuit and a second state to enable said trigger circuit, said processor including a timer to vary a time between (a) detecting the first signal, and (b) resetting and enabling said trigger circuit.

2. The apparatus of claim 1 wherein said at least one power line is a plurality of power lines; and wherein said at least one current sensor is a plurality of current sensors communicating with said power lines, each of said current sensors having a pair of outputs, said outputs being electrically connected in series in order to provide one pair of outputs to said trigger circuit.

3. The apparatus of claim 2 wherein a first one of said current sensors senses a surge condition associated with a first one of said power lines; and wherein a second one of said current sensors, which is electrically connected in series with said first one of said current sensors, reduces a rise time of a signal generated by said first one of said current sensors.

4. The apparatus of claim 2 wherein said current sensors are current transformers, each of said current transformers having an opening for one of said power lines.

5. The apparatus of claim 1 wherein said processor includes a non-volatile memory; and wherein said processor stores said count value in said non-volatile memory.

6. The apparatus of claim 1 wherein said processor determines said time based upon an initial value, an incremental value, and a count of events determined by detecting said first signal.

7. The apparatus of claim 6 wherein said initial value is about 10 microseconds and said incremental value is about 6 microseconds.

8. The apparatus of claim 6 wherein said timer is a second timer; and wherein said processor further includes a first timer, which resets said second timer and restores said time to said initial value.

9. The apparatus of claim 8 wherein said first timer has a time of about 500 microseconds; and wherein said initial value is about 10 microseconds and said incremental value is about 6 microseconds.

10. The apparatus of claim 1 wherein said processor is a microcontroller.

11. The apparatus of claim 1 wherein said processor includes an input and an output; wherein said at least one current sensor includes a first output and a second output; and wherein said trigger circuit comprises:
a capacitor having a first lead, which is electrically connected to said first output, and a second lead;
an SCR having a gate, which is electrically connected to the second lead of said capacitor, an anode, which is electrically connected to the input of said processor, and a cathode;
a switching transistor electrically connected between the cathode of said SCR and the second output of said at least one current sensor, said switching transistor having an input electrically interconnected with the output of said processor, said processor turning said switching transistor off through the output of said processor to reset said trigger circuit, said processor turning said switching transistor on through the output of said processor to enable said trigger circuit, said processor detecting the first signal at the input of said processor from the anode of said SCR.

12. The apparatus of claim 1 wherein said processor includes an input and an output; wherein said at least one current sensor includes a first output and a second output; and wherein said trigger circuit comprises:
a capacitor having a first lead, which is electrically connected to said first output, and a second lead; and
a monostable having a trigger input, which is electrically connected to the second lead of said capacitor, an output, which is electrically interconnected with the input of said processor, and a reset input, which is electrically interconnected with the output of said processor, said processor resetting said monostable through the output of said processor to reset said trigger circuit, said processor enabling said monostable through the output of said processor to enable said trigger circuit, said processor detecting the first signal at the input of said processor from the output of said monostable.

13. The apparatus of claim 12 wherein said processor includes a timer to vary a time between (a) detecting the first signal, and (b) resetting and enabling said trigger circuit; wherein said processor determines said time based upon an initial value, an incremental value, and a count of events determined by detecting said first signal; wherein said timer is a second timer; wherein said processor further includes a first timer, which resets said second timer and restores said time to said initial value; and wherein said monostable has an output pulse width on the output thereof which is greater than a time of said first timer.

14. A surge counter/detector system comprising:
a surge suppressor for a plurality of power lines;
a plurality of current sensors operatively associated with said power lines to sense a surge condition;
a trigger circuit communicating with said current sensors, said trigger circuit outputting a first signal in response to said sensed surge condition, and being reset and enabled by a second signal in order to enable subsequent output of said first signal; and
a processor detecting the first signal from said trigger circuit, and responsively incrementing and displaying a count value, said processor providing the second signal having a first state to reset said trigger circuit and a second state to enable said trigger circuit, said processor including a timer to vary a time between (a) detecting the first signal, and (b) resetting and enabling said trigger circuit.

15. The system of claim 14 wherein each of said current sensors has a pair of outputs, said outputs being electrically connected in series in order to provide one pair of outputs to said trigger circuit.

16. The system of claim 14 wherein a first one of said current sensors senses a surge condition associated with a first one of said power lines; and wherein a second one of said current sensors, which is electrically connected in series with said first one of said current sensors, reduces a rise time of a signal generated by said first one of said current sensors.

17. The system of claim 14 wherein said processor determines said time based upon an initial value, an incremental value, and a count of events determined by detecting said first signal.

18. The system of claim 17 wherein said timer is a second timer; and wherein said processor further includes a first timer, which resets said second timer and restores said time to said initial value.

19. A method for detecting and counting surge conditions on a power line, said method comprising:
employing at least one current sensor to sense a surge condition on said at least one power line;
employing a trigger circuit to receive the sensed surge condition from said at least one current sensor;
outputting a first signal at said trigger circuit in response to said received sensed surge condition;

resetting and enabling said trigger circuit by a second signal in order to enable subsequent output of said first signal;

detecting the first signal from said trigger circuit and responsively incrementing and displaying a count value;

outputting the second signal to reset and enable said trigger circuit; and varying a time between (a) detecting the first signal, and (b) outputting the second signal.

20. The method of claim 19 further comprising:

determining said time based upon an initial value, an incremental value, and a count of events determined by detecting said first signal.

21. The method of claim 20 further comprising:

resetting said time to said initial value after a predetermined time.

* * * * *